US012649200B2

(12) United States Patent
Dyck

(10) Patent No.: US 12,649,200 B2
(45) Date of Patent: Jun. 9, 2026

(54) LASER PROCESSING DEVICE HAVING AN OPTICAL ARRANGEMENT WHICH COMPRISES A BEAM SPLITTER

(71) Applicant: 4JET MICROTECH GMBH, Alsdorf (DE)

(72) Inventor: Tobias Dyck, Aachen (DE)

(73) Assignee: 4JETMICROTECHGMBH, Alsdorf (DE)

( * ) Notice: Subject to any disclaimer, the term of this patent is extended or adjusted under 35 U.S.C. 154(b) by 968 days.

(21) Appl. No.: 17/628,860

(22) PCT Filed: Jun. 19, 2020

(86) PCT No.: PCT/EP2020/067141
§ 371 (c)(1),
(2) Date: Jan. 20, 2022

(87) PCT Pub. No.: WO2021/013447
PCT Pub. Date: Jan. 28, 2021

(65) Prior Publication Data
US 2022/0258280 A1 Aug. 18, 2022

(30) Foreign Application Priority Data
Jul. 22, 2019 (DE) ..................... 10 2019 119 790.2

(51) Int. Cl.
B23K 26/067 (2006.01)
B23K 26/06 (2014.01)
(Continued)

(52) U.S. Cl.
CPC ...... B23K 26/0676 (2013.01); B23K 26/0604 (2013.01); B23K 26/0648 (2013.01);
(Continued)

(58) Field of Classification Search
CPC ............ B23K 26/0676; B23K 26/0604; B23K 26/0648; B23K 26/352; B23K 26/0608;
(Continued)

(56) References Cited

U.S. PATENT DOCUMENTS 4,093,338 A    6/1978 Bjorklund et al.
4,907,765 A *  3/1990 Hirschel ................. B64C 21/10
                                            244/130
(Continued)

FOREIGN PATENT DOCUMENTS

DE        21 51 528       4/1972
DE        196 23 352 A1   12/1997
(Continued)

OTHER PUBLICATIONS

International Search Report of PCT/EP2020/067141, Nov. 12, 2020, 6 pages.
(Continued)

*Primary Examiner* — Edward F Landrum
*Assistant Examiner* — Erwin J Wunderlich
(74) *Attorney, Agent, or Firm* — Womble Bond Dickinson (US) LLP

(57) ABSTRACT

A laser processing device comprising: an optical arrangement; wherein the optical arrangement comprises an input for receiving a laser beam; wherein the optical arrangement comprises a beam splitter that splits the laser beam into at least two partial beams; wherein the optical arrangement recombines the partial beams into a laser spot for generating an interference pattern in the laser spot; wherein a first state of the laser beam at the input generates a first interference pattern and a second state of the laser beam generates a second interference pattern; wherein the first state and the second state differ in at least one of (i) a position of the laser beam at the input and (ii) an angle of incidence of the laser
(Continued)

beam with respect to the input; and wherein the optical arrangement is configured such that the second interference pattern continues the first interference pattern in phase.

18 Claims, 5 Drawing Sheets

(51) Int. Cl.

| | | |
|---|---|---|
| *B23K 26/064* | (2014.01) | |
| *B23K 26/352* | (2014.01) | |
| *G02B 27/14* | (2006.01) | |
| *B64C 21/10* | (2006.01) | |
| *G03F 7/00* | (2006.01) | |

(52) U.S. Cl.
 CPC ............ *B23K 26/352* (2015.10); *B64C 21/10* (2013.01); *B64C 2230/26* (2013.01); *G02B 27/14* (2013.01); *G03F 7/70408* (2013.01); *G03F 7/70475* (2013.01)

(58) Field of Classification Search
 CPC .... B23K 26/702; B23K 26/067; B64C 21/10; B64C 2230/26; G02B 27/14; G03F 7/70408; G03F 7/70475
 See application file for complete search history.

(56) References Cited

U.S. PATENT DOCUMENTS

| | | | | |
|---|---|---|---|---|
| 6,882,477 | B1 * | 4/2005 | Schattenburg ...... | G03F 7/70408 359/35 |
| 8,841,046 | B2 * | 9/2014 | Solak ................... | G03F 7/2022 430/1 |
| 9,174,385 | B2 * | 11/2015 | Simon .................. | B23K 26/082 |
| 9,370,843 | B2 | 6/2016 | Lasagni et al. | |
| 10,101,652 | B2 * | 10/2018 | Yajima ................ | G03F 7/70475 |
| 10,866,520 | B2 * | 12/2020 | Yajima ................ | G03F 7/70408 |
| 10,914,944 | B1 * | 2/2021 | Leibovici ............ | G03F 7/70308 |
| 10,969,693 | B2 * | 4/2021 | Humbach ................ | G03F 1/50 |
| 2005/0152646 | A1 | 7/2005 | Chuang et al. | |
| 2007/0109949 | A1 | 5/2007 | Efimov | |
| 2007/0258078 | A1 * | 11/2007 | Troost ................. | G03F 7/70408 355/72 |
| 2008/0311531 | A1 * | 12/2008 | Wang ................... | G03F 7/70408 430/394 |
| 2011/0227255 | A1 | 9/2011 | Murase et al. | |
| 2013/0148677 | A1 * | 6/2013 | Moriya ..................... | H01S 3/10 372/29.014 |
| 2016/0167165 | A1 * | 6/2016 | Roch .................. | B23K 26/0648 219/121.75 |
| 2017/0090289 | A1 * | 3/2017 | Yajima ..................... | G03F 7/22 |
| 2017/0160645 | A1 * | 6/2017 | Li ........................ | G02B 6/3616 |
| 2017/0261847 | A1 | 9/2017 | Yajima et al. | |
| 2019/0310484 | A1 * | 10/2019 | Galvez .................. | G02B 27/14 |
| 2021/0197315 | A1 | 7/2021 | Shiraishi et al. | |

FOREIGN PATENT DOCUMENTS

| | | |
|---|---|---|
| DE | 102011101585 A1 | 11/2012 |
| DE | 10 2011 011 734 B4 | 12/2014 |
| DE | 10 2018 200 036 B3 | 1/2019 |
| DE | 10 2017 216 406 A1 | 3/2019 |
| DE | 20 2019 101 652 U1 | 6/2019 |
| EP | 2976176 B1 | 3/2014 |
| JP | 2006-110587 A | 4/2006 |
| JP | 2008012546 A | 1/2008 |
| JP | 2009176355 A | 8/2009 |
| JP | 2011-194413 A | 10/2011 |
| JP | 2016-093826 A | 5/2016 |
| WO | WO 2018/197555 A1 | 11/2018 |
| WO | 2019/082972 A1 | 5/2019 |

OTHER PUBLICATIONS

International Written Opinion of PCT/EP2020/067141, Nov. 12, 2020, 8 pages.
German Office Action of corresponding 10 2019 119 790.2, Feb. 17, 2021, 10 pages.
German Oral Summons with English translation for Application No. 10 2019 119 790.2, dated May 23, 2024, 21 pages.
Japanese Office action for Patent Application No. 2021-573835, dated May 9, 2024, 10 pages.
Japanese Office Action for JP Patent Application No. 2024-229775, dated Mar. 6, 2026, 6 pages.

* cited by examiner

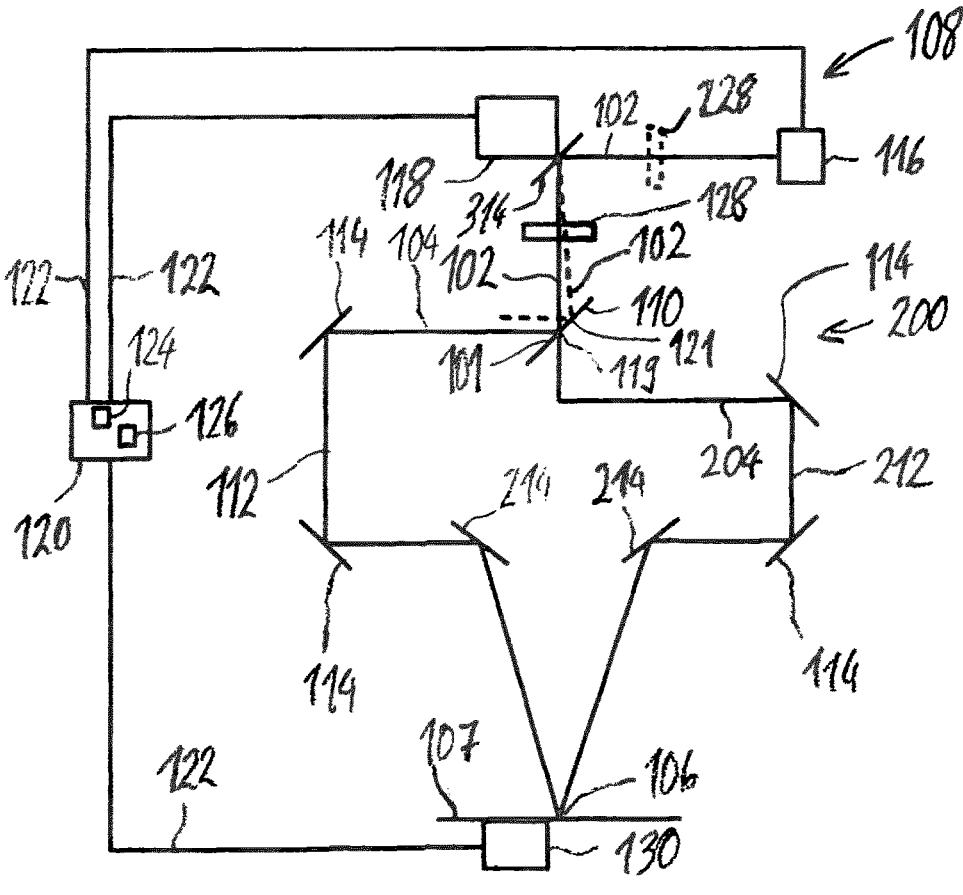
Fig. 2
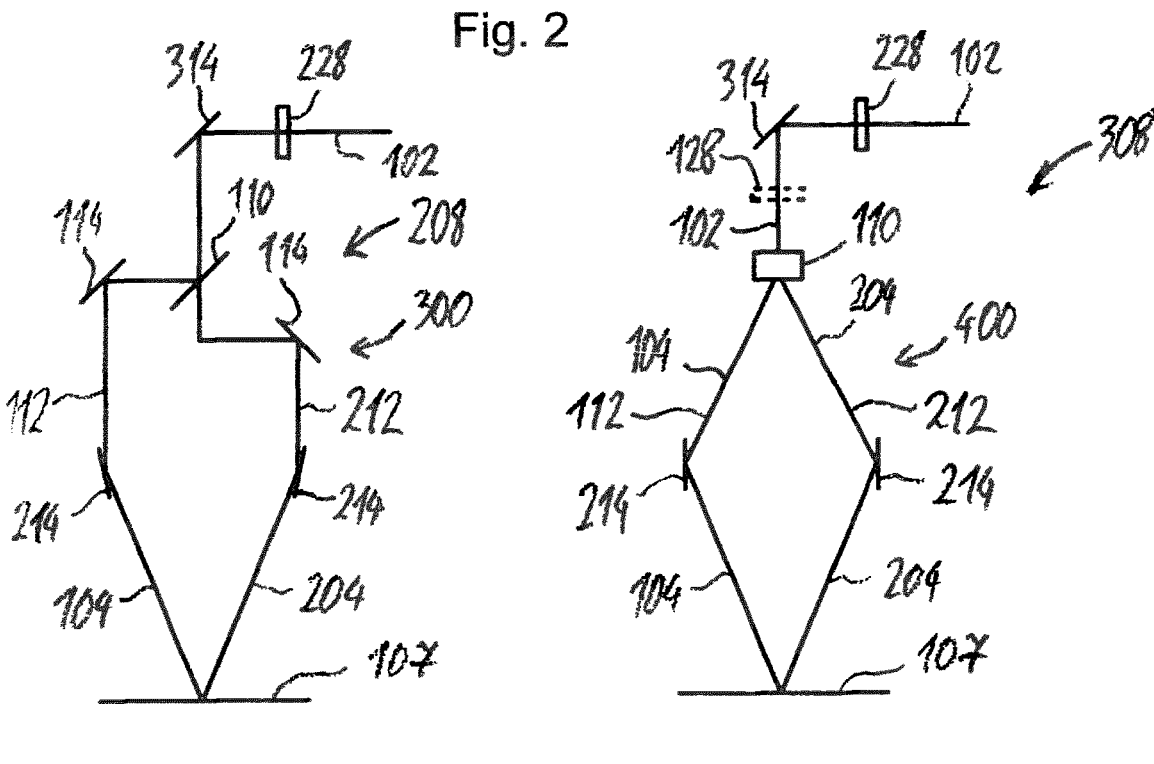
Fig. 3                  Fig. 4

LASER PROCESSING DEVICE HAVING AN OPTICAL ARRANGEMENT WHICH COMPRISES A BEAM SPLITTER

CROSS-REFERENCE TO RELATED APPLICATIONS

This application is the U.S. national phase of International Application No. PCT/EP2020/067141 filed 19 Jun. 2020 which designated the U.S. and claims priority to German Patent Application No. 10 2019 119 790.2 filed 22 Jul. 2019.

TECHNICAL FIELD

The subject matter disclosed herein relates to the field of laser processing devices.

BACKGROUND

Processing of surfaces and components by means of laser radiation has a wide range of applications, for example the structuring of surfaces. For example, WO 2018/197555 A1 discloses a method and a device for producing riblets (i.e. ridges), wherein the riblets are introduced into a surface, in particular into a surface that has already been painted (lacquered) and cured, by means of laser interference patterning (DLIP—Direct Laser Interference Patterning). A component with riblets produced in this manner enables to operate aircraft, ships and wind turbines with lower flow resistance.

SUMMARY

In view of the situation described above, there may be a need for a technique that allows the structuring of surfaces with improved characteristics.

This need may be met by the subject matter of the independent claims. Advantageous embodiments are indicated in the dependent claims.

In accordance with a first aspect of the subject matter disclosed herein, a device is disclosed, in particular a laser processing device.

According to embodiments of the first aspect, a laser processing device is disclosed, the laser processing device comprising: an optical arrangement (an optical device); wherein the optical arrangement has an input for receiving a laser beam; and wherein the optical arrangement has a beam splitter that splits the laser beam into at least two partial beams (sub-beams); and wherein the optical arrangement recombines the partial beams into (to) a laser spot for generating an interference pattern in the laser spot; wherein a change in a position of the laser beam at the input and/or a change in an angle of incidence of the laser beam with respect to the input causes at least one of the following: (i) a distance change (change in distance, distance variation) DP of a distance between a center of the laser spot and an interference maximum of the interference pattern closest (nearest) in a predetermined direction, (ii) a position change (change in position, position variation) DS of a position of the center of the laser spot; wherein the optical arrangement is configured such that a condition of $$|DS|+|DP|=n*L \qquad \text{(equation 1)}$$

is valid for a continuous position change DS, and wherein n is a natural number; wherein L is a distance between two adjacent interference maxima of the interference pattern in the predetermined direction, including a tolerance range of ±5%; and wherein the distance change DP is defined by a difference between (of) of a first distance and a second distance; and wherein each of the first distance and the second distance is defined in the predetermined direction.

In accordance with a second aspect of the subject matter disclosed herein, a method is disclosed.

According to embodiments of the second aspect, a method for interference patterning a surface is disclosed, the method comprising: generating a first interference pattern on the surface; generating a second interference pattern on the surface; wherein the generating of the first interference pattern and the second interference pattern is performed by a single optical arrangement having an input; wherein the first interference pattern and the second interference pattern are generated by the optical arrangement by changing a position of the laser beam at the input and/or an angle of incidence of the laser beam with respect to the input, and thereby (i) a distance change DP of a distance between a center of the laser spot and an interference maximum of the interference pattern closest in a predetermined direction occurs, and/or (ii) a position change DS of a position of the center of the laser spot occurs; wherein the optical arrangement is configured such that a condition $$|DS|+|DP|=n*L \qquad \text{(equation 1)}$$

is fulfilled for a continuous position change DS; and wherein n is a natural number; L is a distance between two adjacent interference maxima of the first interference pattern, including a tolerance range of ±5%; and wherein the distance change DP is defined by a difference between a first distance and a second distance; and wherein each of the first distance and the second distance is defined in the predetermined direction.

According to an embodiment of a third aspect, a use is disclosed.

According to embodiments of the third aspect, there is disclosed: A use of an optical arrangement for generating a first interference pattern and a second interference pattern by changing a position of the laser beam at the input and/or changing an angle of incidence of the laser beam with respect to the input, and thereby causing at least one of: (i) a distance change DP of a distance between a center of the laser spot and an interference maximum of the interference pattern closest in a predetermined direction, (ii) a position change DS of a position of the center of the laser spot; wherein the optical arrangement is configured such that a condition of $$|DS|+|DP|=n*L \qquad \text{(equation 1)}$$

is valid for a continuous position change DS; and wherein n is a natural number; L is a distance between two adjacent interference maxima of the interference pattern, including a tolerance range of ±5%; and wherein the distance change DP is defined by a difference between a first distance and a second distance; and wherein each of the first distance and the second distance is defined in the predetermined direction.

In accordance with a fourth aspect of the subject matter disclosed herein, a laser processing device is disclosed.

According to embodiments of the fourth aspect, a laser processing device is disclosed, the laser processing device comprising: an optical arrangement; wherein the optical arrangement comprises an input for receiving a laser beam; and wherein the optical arrangement comprises a beam splitter that splits the laser beam into at least two partial beams; and wherein the optical arrangement recombines the partial beams into a laser spot for generating an interference pattern in the laser spot; wherein a first state of the laser beam at the input generates a first interference pattern and a second state of the laser beam generates a second interference pattern; wherein the first state and the second state differ in at least one of (i) a position of the laser beam at the input and (ii) an angle of incidence of the laser beam with respect to the input; and wherein the optical arrangement is configured such that the second interference pattern continues the first interference pattern in phase.

In accordance with a fifth aspect of the subject matter disclosed herein, a method is disclosed.

According to embodiments of the fifth aspect, a method is disclosed, the method comprising: providing an optical arrangement having a beam splitter that splits a laser beam into at least two partial beams, wherein the optical arrangement recombines the partial beams into a laser spot; directing a laser beam at an input of the optical arrangement; wherein a first state of the laser beam at the input generates the laser spot at a first position P1, wherein the laser spot has a first interference pattern; wherein a second state of the laser beam at the input generates the laser spot at a second position P2, wherein the laser spot has a second interference pattern; wherein the first state and the second state differ in at least one of (i) a position of the laser beam at the input and (ii) an angle of incidence of the laser beam with respect to the input; and wherein the optical arrangement provides, for the position change $DS=P1-P2$, a difference $DI\_AB=DI\_A-DI\_B$ between a first optical path length difference $DI\_A$ and a second optical path length difference $DI\_B$ which causes a distance change DP between a center of the laser spot and an interference maximum of the interference pattern closest in a predetermined direction so that the second interference pattern continues the first interference pattern in phase.

In accordance with a sixth aspect of the subject matter disclosed herein, a laser processing device is disclosed.

According to embodiments of the sixth aspect, a laser processing device is disclosed comprising: an optical arrangement; wherein the optical arrangement comprises an input for receiving a laser beam; wherein the optical arrangement comprises a beam splitter that splits the laser beam into at least two partial beams; wherein the optical arrangement recombines the partial beams into a laser spot for generating an interference pattern in the laser spot; wherein a first state of the laser beam at the input generates a first interference pattern and a second state of the laser beam generates a second interference pattern; wherein the first state and the second state differ in at least one of (i) a position of the laser beam at the input and (ii) an angle of incidence of the laser beam with respect to the input; wherein a center of the first interference pattern and a center of the second interference pattern have a distance which corresponds to at least a single diameter of the laser spot, in particular at least five times the diameter of the laser spot, further in particular at least ten times the diameter of the laser spot, further in particular at least twenty times the diameter of the laser spot; wherein a change in (of) a path length of a radiation path of each of the partial beams due to the change in state from the first state to the second state is less than ±5% of the total path length of the radiation path from the beam splitter to the laser spot, in particular less than ±1% and further in particular less than ±0.5%.

In accordance with a seventh aspect of the subject matter disclosed herein, an object is disclosed.

According to embodiments of the seventh aspect, an object is disclosed having a surface comprising a periodic surface structure, wherein the surface structure is delimited (defined) by a circumferential line (perimeter line), and wherein the circumferential line has, at least in sections in a circumferential line portion, a shape that is a periodic repetition of a basic element (base element, base member), and wherein a periodicity of the surface structure differs from a periodicity of the circumferential line portion.

In accordance with an eighth aspect of the subject matter disclosed herein, an object is disclosed.

According to embodiments of the eighth aspect, an object is disclosed having a surface, wherein the surface has a surface structure; wherein the surface structure has a maximum extent in depth with respect to the surface; an extent in depth of the surface structure increasing from a first position at an edge of the surface structure to a second position to 80% of the maximum extent in depth; and a distance between the first position and the second position being at least 100 μm.

Various aspects and embodiments of the subject matter disclosed herein are based on the idea that an interference pattern of a laser spot continues in phase beyond the laser spot. This can be achieved, for example, by appropriately controlling the phase, for example by supplying an appropriate difference $DI\_AB$ between the optical path length difference of the first state and the optical path length difference of the second state. Furthermore, the inventors have found that, contrary to the view of those skilled in the art, at least for certain optical arrangements, an "automatic" continuation of an interference pattern in phase beyond the spatial extent of a laser spot is possible only due to the design or setup of the optical arrangement. At least in applications in which large-area processing with periodic patterns is advantageous, a laser processing device may be configured in an extremely efficient manner by the phase-true continuation.

According to embodiments of the first aspect, the laser processing device is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the second aspect, the method is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the third aspect, the use is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the fourth aspect, the laser processing device is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the fifth aspect, the method is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the sixth aspect, the laser processing device is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the seventh aspect, the object is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

According to embodiments of the eighth aspect, the object is configured to provide the functionality of one or more of the embodiments disclosed herein and/or to provide the functionality as required for one or more of the embodiments disclosed herein, in particular the embodiments of the first, second, third, fourth, fifth, sixth, seventh, and/or eighth aspect.

Further advantages and features of the subject matter disclosed herein will be apparent from the following exemplary description of currently preferred embodiments, to which, however, the present disclosure is not limited. The individual figures of the drawings of this application are to be regarded as schematic only and not necessarily to scale.

BRIEF DESCRIPTION OF THE DRAWINGS

FIG. 2 shows a laser processing device according to embodiments of the subject matter disclosed herein.

FIG. 3 shows a portion of a laser processing device according to embodiments of the subject matter disclosed herein.

FIG. 4 shows a portion of a laser processing device according to embodiments of the subject matter disclosed herein.

DESCRIPTION OF EXEMPLARY EMBODIMENTS

Figure 1:
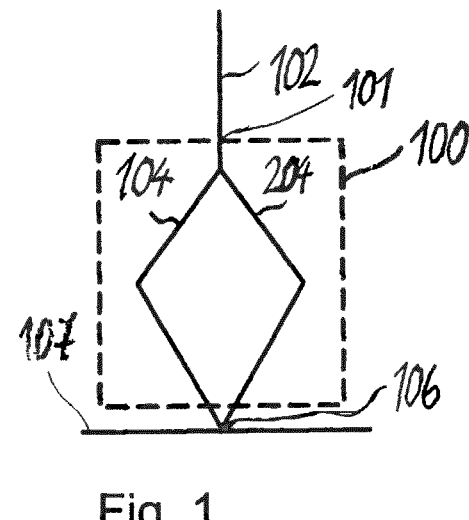
FIG. 1 schematically shows a functional principle of an optical arrangement according to embodiments of the subject matter disclosed herein.

In the following, exemplary embodiments of the subject matter disclosed herein are described with reference to, for example, a laser processing device, a method, a use, and an object. It should be emphasized that, of course, any combination of features of various aspects, embodiments, and examples is possible. In particular, some embodiments are described with reference to a method or a use, while other embodiments are described with reference to a device, in particular a laser processing device or an object. However, it will be understood by those skilled in the art from the foregoing and subsequent description, claims, and drawings that, unless otherwise indicated, features of different aspects, embodiments, and examples may be combined and such combinations of features are to be considered disclosed by this application. For example, even a feature relating to a method or use is combinable with a feature relating to a device (for example, a laser processing device or object), and vice versa. Further, a feature of an embodiment relating to a device is combinable with a corresponding feature relating to a method or use. With the disclosure of a method, an embodiment of a method or a function, one or more actuators as well as a functionality of a control device cooperating with the actuators are further to be regarded as disclosed, which are designed to execute the method or the function. Further, with the disclosure of a function of a device, a corresponding method defining the function without device features is to be considered disclosed. Further, features of an interference pattern define analogous features of a surface structure or a processing spot (surface area processed by a laser spot having the interference pattern).

A method may be implemented as computer-readable instruction code using any suitable programming language, such as, for example, JAVA, C#, etc., and may be stored on a computer-readable medium (removable disc, volatile or non-volatile memory, embedded memory/processor, etc.). The instruction code is operable to program a computer or any other programmable processing device to perform the intended functions. The instruction code may be available from a network, for example from the WorldWideWeb, from which it may be downloaded.

The subject matter disclosed herein may be realized by means of a program element or software. However, the subject matter disclosed herein may also be realized by means of one or more specific electronic circuits or hardware. Further, the subject matter disclosed herein may also be realized in hybrid form, i.e., in a combination of software modules and hardware modules.

Unless otherwise indicated, numerical values are to be understood including a ±5% window, i.e., for example, according to an embodiment, an indication of a length of 10 mm comprises a length within an interval of (10 mm±5%) =[9.95 mm; 10.05 mm] and according to an embodiment, a percentage indication of 50% comprises a percentage indication within an interval of 50%±5%=[47.5%; 52.5%]. According to a further embodiment, numerical values are to be understood including a ±10% window.

According to an embodiment, a device is disclosed. According to a further embodiment, the device is a laser processing device. According to a further embodiment, the device comprises an optical arrangement, wherein the optical arrangement comprises an input for receiving a laser beam. According to a further embodiment, the optical arrangement comprises a beam splitter that splits the laser beam into two or more partial beams, wherein the optical arrangement recombines the partial beams into a laser spot for generating an interference pattern in the laser spot. According to a further embodiment, a change in a position of the laser beam at the input and/or a change in an angle of incidence of the laser beam with respect to the input causes at least one of the following: (i) a distance change DP of a distance between a center of the laser spot and an interference maximum of the interference pattern closest in a predetermined direction, (ii) a position change DS of a position of the center of the laser spot. According to an embodiment, the optical arrangement is configured such that the condition in the following equation 1

$$|DS|+|DP|=n*L \qquad \text{(equation 1)}$$

is valid for a continuous position change DS, and wherein n is a natural number. Here, L is a distance between two adjacent interference maxima of the interference pattern in the predetermined direction, including a tolerance range of ±5%. In other words, according to an embodiment, the condition need not be fulfilled exactly, but deviations in the order of ±5% from the exact value n*L are also tolerable, i.e., the condition is considered to be fulfilled also for deviations that are within the tolerance range. Generally, according to a further embodiment, the tolerance range is ±3% or, according to yet another embodiment, ±1%. According to yet another embodiment, equation 1 is exactly fulfilled (tolerance range 0%). Further, the distance change DP is defined by a difference between a first distance and a second distance, each of the first distance and the second distance being defined in the predetermined direction. Accordingly, the first distance and the second distance indicate the distance between the center of the laser spot in question and the closest (nearest) interference maximum, in the predetermined direction, of the interference pattern of the laser spot in question. | | is here the known absolute value function, i.e. |x|=x for x≥0 and |x|=−x for x<0.

Correspondingly, according to an embodiment, a method has one or more of the following embodiments. According to an embodiment, a method of interference patterning a surface comprises one or more of the following features: generating a first interference pattern on the surface; generating a second interference pattern on the surface; wherein generating the first interference pattern and the second interference pattern is performed by a single optical arrangement comprising an input. According to an embodiment, the first interference pattern and the second interference pattern are generated by the optical arrangement by changing a position of the laser beam at the input and/or an angle of incidence of the laser beam with respect to the input, and thereby (i) a distance change DP of a distance between a center of the laser spot and an interference maximum of the interference pattern closest in a predetermined direction occurs, and/or (ii) a position change DS of a position of the center of the laser spot occurs.

According to a further embodiment, a method comprises one or more of the following features: providing an optical arrangement having a beam splitter that splits a laser beam into at least two partial beams, wherein the optical arrangement recombines the partial beams into a laser spot; directing a laser beam at an input of the optical arrangement; wherein a first state of the laser beam at the input generates the laser spot at a first position P1, wherein the laser spot has a first interference pattern; wherein a second state of the laser beam at the input generates the laser spot at a second position P2, wherein the laser spot has a second interference pattern; wherein the first state and the second state differ in at least one of (i) a position of the laser beam at the input and (ii) an angle of incidence of the laser beam with respect to the input and wherein the optical arrangement (or, according to another embodiment, the method) provides, for the position change DS=P1−P2, a difference DI_AB=DI_A−DI_B between a first optical path length difference DI_A and a second optical path length difference DI_B which causes a distance change DP between a center of the laser spot and an interference maximum of the interference pattern closest in a predetermined direction so that the second interference pattern continues the first interference pattern in phase.

According to an embodiment, the optical arrangement is configured to satisfy the condition according to Equation 1 for a continuous position change DS.

The position of the laser beam at the input and/or the change in the angle of incidence of the laser beam with respect to the input may also be more generally described as state of the laser beam at the input. According to an embodiment, the input of the optical arrangement is generated by the beam splitter. Of course, this does not exclude that optical elements are arranged in front of (upstream) the beam splitter, which then, however, do not belong to the optical arrangement in this sense.

In this sense, according to an embodiment, a first state of the laser beam at the input generates a first interference pattern in the laser spot (in a first laser spot, the first laser spot having its center at a first position P1) and a second state of the laser beam at the input generates a second interference pattern in the laser spot (in a second laser spot, the second laser spot having its center at a second position P2), wherein the first state and the second state differ in at least one of (i) a position of the laser beam at the input and (i) an angle of incidence of the laser beam with respect to the input.

In accordance with the foregoing, according to an embodiment, a use of an optical arrangement for generating a first interference pattern and a second interference pattern by changing a position of the laser beam at the input and/or changing an angle of incidence of the laser beam with respect to the input and thereby causing at least one of: (i) a distance change DP of a distance between a center of the laser spot and an interference maximum of the interference pattern closest in a predetermined direction, (ii) a position change DS of a position of the center of the laser spot, wherein the optical arrangement is configured such that the condition according to Equation 1 is fulfilled.

According to yet another embodiment, a laser processing device comprises one or more of the following features: an optical arrangement; wherein the optical arrangement comprises an input for receiving a laser beam; and wherein the optical arrangement comprises a beam splitter that splits the laser beam into at least two partial beams; and wherein the optical arrangement recombines the partial beams into a laser spot for generating an interference pattern in the laser spot; wherein a first state of the laser beam at the input generates a first interference pattern and a second state of the laser beam at the input generates a second interference pattern; and wherein the first state and the second state differ in at least one of (i) a position of the laser beam at the input and (ii) an angle of incidence of the laser beam with respect to the input; and wherein the optical arrangement is configured such that the second interference pattern continues the first interference pattern in phase.

Changing the state of the laser beam at the input, and in particular changing the position of the laser beam at the input and/or changing the angle of incidence of the laser beam with respect to the input, does not preclude also moving the optical arrangement and the surface relative to each other in order to pattern larger surface areas. For example, in case of a 2-beam interference (resulting in an interference pattern comprising a plurality of parallel lines), the optical arrangement may be moved in a direction of the longitudinal extension of the lines in order to achieve large area surface patterning, as is desirable, for example, in an application in which the surface pattern generated by the interference pattern forms so-called riblets on a flow element, such as a part of an aircraft.

According to an embodiment, the optical arrangement is configured such that the second interference pattern continues the first interference pattern in phase.

For example, according to an embodiment, the corresponding configuration of the optical arrangement may be active, for example by adjusting the distance change DP by an appropriate actuator arrangement acting, for example, on a mirror arrangement or an optical medium. For example, a wedge-shaped optical element could be used for this purpose, which is moved further into or out of one of the partial beams, thereby increasing or decreasing the path length of the partial beam within the wedge-shaped optical element and thus changing the phase position (and thus DP). The control signals for the actuator arrangement can be generated, for example, from the determination of the state of the laser beam with the aid of a look-up table or, for example, also by a suitably trained artificial intelligence.

Furthermore, according to an embodiment, the configuration of the optical arrangement for in-phase continuation of the first interference pattern may have a passive configuration, for example when individual elements of the optical arrangement as well as the interaction of the individual optical elements are configured in such a way that the phase-true (in-phase) continuation of the first interference pattern is performed solely due to the (static) design or set-up of the optical arrangement, in any case within a certain range of validity, for example a range of validity for the state of the laser beam (for example within a certain range of validity for the position of the laser beam at the input and/or the angle of incidence of the laser beam with respect to the input) or a range of validity for the position change DS. Generally, according to an embodiment, equation 1 is fulfilled at least within a validity range.

According to an embodiment, the first state of the laser beam at the input defines the first position P1 of the center of the laser spot and the first interference pattern, and the second state of the laser beam at the input defines a second position P2 of the center of the laser spot and a second interference pattern, wherein a pair of partial beams of the at least two partial beams in the first state has a first optical path length difference DI_A and the pair of partial beams in the second state has a second optical path length difference DI_B; and wherein the optical arrangement provides, for the corresponding position change DS=P1–P2, a difference DI_AB=DI_A–DI_B between the first optical path length difference DI_A and the second optical path length difference DI_B which causes a distance change DP so that the second interference pattern continues the first interference pattern in phase.

According to an embodiment, the predetermined direction in which both the first distance and the second distance are defined is a direction pointing away from the center of the laser spot and towards the interference maximum (for example, of the first interference pattern, i.e., according to an embodiment, the first interference pattern defines the predetermined direction) closest in that direction. For example, if the interference pattern comprises a plurality of parallel interference lines (resulting for example from a two-beam interference), according to an embodiment, the predetermined direction is a direction perpendicular to the interference lines. For example, in this case, the predetermined direction may be defined as a direction perpendicular to the interference lines and pointing to the right from the center of the laser spot.

As is known to those skilled in the art, in the case of interference of three or more partial beams, for example in the case of three partial beams (three-beam interference), the interference pattern is, for example, a dot pattern. According to an embodiment, there exist two linearly independent from each other predetermined directions along which the interference pattern can be continued in phase, which is particularly advantageous in the case of three-beam interference.

It will be understood that although in some embodiments reference is made only to single different distances, for example a first distance and a second distance, the relevant embodiments apply to all distances as long as the specified condition in Equation 1 is satisfied.

According to an embodiment, the condition in Equation 1 is valid in a predetermined range of validity (for example, a range of validity defined by the optical arrangement). According to an embodiment, the condition in equation 1 is valid at least up to a position change value equal to the diameter of the laser spot. According to a further embodiment, the condition in equation 1 is valid for a continuous position change DS from an initial position (position change equal to zero) to the position change value. According to a further embodiment, the position change value is equal to two times or, according to yet other embodiments, five times, ten times or twenty times the diameter of the laser spot.

According to an embodiment, the input comprises a first region and a second region and the laser processing device comprises an actuator arrangement for positioning the laser beam in the first region and subsequently in the second region.

For example, according to an embodiment, the actuator arrangement is an actuator arrangement of a laser scanner, by means of which the laser beam can be scanned via (above, along) the input and, in particular, the first region and the second region of the input. In this way, a continuous and phase-true continuation of the interference pattern of a laser spot is possible.

In the sense of the above mentioned embodiments, the first state may for example correspond to the laser beam incident on the first region and the second state may correspond to the laser beam incident on the second region.

According to an embodiment, the first interference pattern and the second interference pattern overlap. For example, according to an embodiment, the first interference pattern and the second interference pattern have a plurality of intensity maxima and intensity minima arranged sequentially in a longitudinal direction. According to an embodiment, the second interference pattern is offset with respect to the first interference pattern in the longitudinal direction (or parallel to the longitudinal direction). Further, according to an embodiment, the longitudinal direction corresponds to the predetermined direction.

If there are at least two linearly independent longitudinal directions (for example, according to an embodiment, in the case of a 3-beam interference), the predetermined direction in which the first distance and the second distance are defined is parallel to at least one of the longitudinal directions.

According to an embodiment, the optical arrangement comprises at least one optical element operating in transmission (in other words, the at least one optical element is a transmitting optical element). According to an embodiment, a change of a path length section of a radiation path of each of the partial beams in the transmitting optical element (i.e. of each of the partial beams whose radiation path passes through the transmitting optical element) is smaller than ±5%, in particular smaller than ±1% and further in particular smaller than ±0.5%, wherein the change of the path length section is caused by a change in state of the laser beam at the input. According to an embodiment (i.e. optionally but not necessarily), all partial beams of the at least two partial beams (which the beam splitter generates from the laser beam) pass through the transmitting optical element.

According to an embodiment, the foregoing embodiments with respect to the transmitting optical element apply to each transmitting optical element of the optical arrangement.

According to an embodiment, of each transmitting optical element of the optical arrangement after or downstream of the beam splitter, each transirradiated surface pair located in a radiation path of at least one of the partial beams encloses an angle of at most 10 degrees, in particular an angle of at most 5 degrees. In experiments, it has been found that a smaller angle may promote the in-phase continuation of the interference pattern.

According to an embodiment, the optical arrangement defines, for at least one partial beam of the at least two partial beams, a radiation path for which the following applies: The radiation path defines, for a first position of the laser spot, a first path difference between an optical path length of the radiation path and a geometric path length of the radiation path; the radiation path defines, for a second position of the laser spot, a second path difference between an optical path length of the radiation path and a geometric path length of the radiation path; and in a range of validity of the condition, at least one of the following applies: (i) a deviation between the first path difference and the second path difference is so small that the condition is satisfied; (ii) a deviation between the first path difference and the second path difference is less than twenty times, in particular less than ten times, the wavelength of the laser beam; (iii) both the first path difference and the second path difference are less than 10 mm, in particular less than 5 mm.

According to an embodiment, the optical arrangement downstream of the beam splitter does not comprise a prism.

Without wishing to limit the consideration to a theory, according to the present understanding of the inventors, a large deviation of a path length difference between an optical path length of a radiation path and a geometric path length of a radiation path adversely affects the range of validity when the state of the laser beam is changed or the position of the laser spot is changed, or even prevents an in-phase continuation of the interference pattern of a laser spot.

According to an embodiment, a deviation between the first path length difference and the second path length difference is sufficiently small in the above sense if the deviation is less than 10% of the wavelength of the laser beam or the deviation causes a shift of the interference pattern out of the ideal phase of less than 5% of the distance L between two adjacent interference maxima in the predetermined direction.

According to an embodiment, all optical elements of the optical arrangement operate in reflection, in particular according to an embodiment all optical elements of the optical arrangement operate exclusively in reflection. In other words, all optical elements of the optical arrangement are reflective elements, according to a further embodiment, with the exception of the beam splitter.

According to an embodiment, the term "operate in reflection" has the meaning in this application that the optical element in question has an optical function based on reflection of incident electromagnetic radiation and contributes with this optical function to the overall function of the optical arrangement. In this sense, a semi-permeable mirror also operates in reflection.

According to an embodiment, the beam splitter is a semi-permeable mirror. According to an embodiment, a semi-permeable mirror is an optically transmitting medium having planar surfaces, wherein at least one layer, in particular a dielectric layer stack, is applied on one of the planar surfaces (on an input side) so that a certain portion of the incident laser intensity is (intentionally) reflected and another portion is (intentionally) transmitted. The portion of the incident laser intensity that is reflected is also referred to herein as reflected laser radiation. The portion of the incident laser intensity that is transmitted is also referred to herein as transmitted laser radiation. The incident laser intensity is also referred to herein as the intensity of the laser beam. On the output side of the optically transmitting medium, according to an embodiment, a dielectric layer stack is optionally also applied which has an anti-reflection effect, so that the intensity which has entered the medium can exit again with low losses. According to an embodiment, the transmitted radiation and the reflected radiation have a similar (or even the same) beam shape and/or a similar (or even the same) beam profile. Further, according to an embodiment, the transmitted radiation and the reflected radiation have the same polarization. This has the advantage that the polarization does not have to be readjusted later in one of the beams. According to an embodiment, both partial beams require the same polarization in order to obtain good interference.

According to an embodiment, the semi-permeable mirror is configured to reflect a significant portion (greater than 10%) of the incident laser intensity and to transmit a significant portion (greater than 10%) of the incident laser intensity. Advantageously, the optically transmitting medium exhibits low absorption for the laser beam.

According to an embodiment, the beam splitter is configured such that the intensity of the reflected laser radiation and the intensity of the transmitted laser radiation are equal. Beam splitters of this type are referred to as 50:50 beam splitters. According to a further embodiment, the beam splitter is a non-polarizing 50:50 beam splitter.

According to an embodiment, the beam splitter is configured and arranged such that the laser beam generates a first intensity distribution among the at least two partial beams when incident on the first region (of the input) and generates a second intensity distribution among the at least two partial beams when incident on the second region (of the input). According to an embodiment, the first intensity distribution and the second intensity distribution differ by less than 10%. In other words, according to an embodiment, the intensity distribution in the at least two partial beams is independent of the state of the laser beam within a tolerance range of 10%.

According to an embodiment, processing an object with a laser processing device as described herein or with a method as described herein results in the object being provided with a surface structure according to embodiments of the subject matter disclosed herein.

According to an embodiment, an object comprises a surface having a periodic surface structure, wherein the surface structure defines a circumferential line which is an envelope of the surface structure, and wherein the circumferential line has, at least in sections in a circumferential line portion, a shape which is a periodic repetition of a basic element, and wherein a periodicity of the surface structure is different from a periodicity of the circumferential line portion.

In particular, an edge region of the surface structure may reflect the cross-sectional shape of the laser spot (or the processing spot generated thereby).

According to an embodiment, the surface structure has at least one of the following features: (i) the surface structure has a plurality of parallel trenches; (ii) the basic element has at least one arcuate portion (for example, a single arcuate portion or two or more arcuate portions); (iii) the circumferential line portion is a first circumferential line portion, the basic element is a first basic element, and the circumferential line has a second circumferential line portion which is opposite the first circumferential line portion and which is a periodic repetition of a second basic element, and wherein a periodicity of the surface structure is different from a periodicity of the second circumferential line portion.

According to another embodiment, an object has a surface comprising a surface structure, wherein the surface structure has a maximum extent in depth with respect to the surface; an extent in depth of the surface structure increases to 80% of the maximum extent in depth from a first position at an edge of the surface structure to a second position; and a distance between the first position and the second position is at least 100 μm. In other words, an extent in depth of the surface structure increases from a first position at an edge of the surface structure to a second position to at most 80% of the maximum extent in depth, wherein a distance between the first position and the second position is 100 μm.

The slow increase of the extent in depth of the surface structure departing from an edge of the surface structure (80% of the maximum extent in depth is reached only after 100 μm or more) may be fluidically advantageous, in particular if the surface structure is a riblet structure, in particular a riblet structure as described herein. According to an embodiment, the slow increase of the extent in depth as described herein occurs at least in a direction that is, for example, parallel to a flow direction in which the surface structure is to be flowed against.

DETAILED DESCRIPTION

Exemplary embodiments of the subject matter disclosed herein are described below with reference to the drawings. It is noted that in various figures, similar or identical features or components are sometimes provided with the same reference numerals, or with reference numerals differing only in the first digit. Features or components which are identical or at least functionally identical to the corresponding features or components in another figure are described in detail only on their first occurrence in the following text, and the description is not repeated on subsequent occurrences of these features and components (or the corresponding reference numerals). According to an embodiment, the preceding definitions apply to subsequent embodiments, and vice versa. Furthermore, the features and embodiments described above may be combined with the features and embodiments described below.

FIG. 1 schematically shows a functional principal or theory of operation of an optical arrangement 100 in accordance with embodiments of the subject matter disclosed herein.

According to an embodiment, the optical arrangement 100 comprises an input 101 for receiving a laser beam 102. According to an embodiment, the optical arrangement 100 is configured to split the laser beam 102 into at least two (for example two) partial beams 104, 204, and to recombine the partial beams 104, 204 into a laser spot 106, for generating an interference pattern in the laser spot 106. According to an embodiment, the radiation paths of the partial beams are of equal or nearly equal length, for example of equal length within a tolerance window of ±5%. In a real setup with a finite beam diameter, the interference results in particular from the angle between the partial beams.

According to an embodiment, a first partial beam 104 of the two partial beams has a first optical path length I1 and a second partial beam 204 of the partial beams has a second optical path length I2. This results in a path length difference DI=I2−I1 of the partial beams. A change in this path length difference DI results in the distance change DP as described herein. According to an embodiment, the laser spot 106 is directed towards a surface 107.

FIG. 2 shows a laser processing device 108 in accordance with embodiments of the subject matter disclosed herein.

According to an embodiment, the laser processing device 108 comprises an optical arrangement 200. According to an embodiment, the optical arrangement 200 comprises a beam splitter 110 that splits a laser beam 102 into two partial beams 104, 204. According to an embodiment, the beam splitter 110 is a semi-permeable mirror, for example as shown in FIG. 2.

According to an embodiment, an input 101 of the optical arrangement 200 is formed by the beam splitter 110. According to another embodiment, the optical arrangement 200 defines a radiation path 112, 212 for each of the partial beams 104, 204. According to an embodiment, the at least two radiation paths comprise a first radiation path 112 and a second radiation path 212. According to another embodiment, at least one of the radiation paths (for example, each radiation path 112, 212) comprises at least one optical element, for example, at least one mirror 114, 214. According to an embodiment, three mirrors 114, 214 may be provided, for example as shown in FIG. 2. According to an embodiment, the at least one mirror 114, 214 defines the course of the respective radiation path 112, 212 through the optical arrangement 200. According to an embodiment, the optical arrangement 200 is configured (for example, by arrangement and/or alignment of the at least one optical element) to combine the partial beams 112, 212 into one laser spot 106. According to an embodiment, the recombination of the partial beams is performed by suitable optical elements, for example mirrors 214, for example as shown in FIG. 2.

According to an embodiment, the optical arrangement 200 is positioned with respect to a surface 107 of an object so that the laser spot 106 and the interference pattern are generated on the surface 107, for processing the surface 107 with the interference pattern. For example, the interference pattern is used to pattern the surface 107. This is also referred to as direct interference patterning.

According to an embodiment, the laser processing device comprises a laser source 116 for generating the laser beam 102. According to another embodiment, the laser source 116 is external to and couplable to the laser processing device.

According to an embodiment, the laser beam is a CO2 laser beam, in particular a $CO_2$ laser beam having a power of at least 800 W (800 watts). Accordingly, according to an embodiment, the laser source is a $CO_2$ laser source. According to an embodiment, the CO2 laser source is configured to be operated in continuous wave or with a pulse duration <1 ms (less than 1 millisecond).

According to a further embodiment, the laser processing device is arranged to structure a lacquer surface (paint surface), in particular a cured lacquer surface.

According to another embodiment, the laser processing device comprises at least one movable mirror 314 and an actuator arrangement 118 for controlling the at least one movable mirror 314. According to an embodiment, the at least one movable mirror 314 is arranged to change a state of the laser beam at the input 101, for example to change a position of the laser beam at the input 101 and/or to change an angle of incidence of the laser beam 102 with respect to the input 101. For example, by pivoting the at least one movable mirror 314, the position and the angle of incidence of the laser beam 102 with respect to the input may be changeable, for example as shown in FIG. 2 by a first state of the laser beam at the input (solid line at 102) and a second state of the laser beam at the input (dashed line at 102). Here, in the first state, the laser beam 102 is positioned in a first region 119 of the semi-permeable mirror 110 (which according to an embodiment is considered to be the input of the optical arrangement) and in the second state, the laser beam 102 is positioned in a second region 121 of the semi-permeable mirror 110.

According to an embodiment, the optical arrangement 200 is configured such that the first state generates a first interference pattern and the second state generates a second interference pattern, wherein the second interference pattern continues the first interference pattern in phase. According to an embodiment, this in-phase continuation of the (first) interference pattern occurs even when there is a continuous change in the state of the laser beam at the input 101, thereby effectively achieving an enlarged resulting interference pattern in terms of its dimensions while achieving a defined phase relationship of the interference maxima and interference minima in the enlarged interference pattern. Compared to a diversification of a single laser spot, a more homogeneous processing is achieved by the in-phase continuation of the interference pattern, since a single laser spot typically has a Gaussian beam profile. According to an embodiment, the homogeneous processing of a surface is achieved by a uniform integrated total intensity per unit area, wherein the generated intensity maxima are in phase (phase-true).

The resulting interference pattern may be generated, for example, by pivoting the laser beam 102 across the input 101, i.e., according to an embodiment, by pivoting the laser beam 102 across the beam splitter 110.

According to an embodiment, an optical element 128, in particular an optical element for focusing the laser beam, is provided, for example as part of the optical arrangement or as part of the laser processing device. According to an embodiment, the optical element for focusing the laser beam is a lens, for example a lens arranged between the at least one movable mirror 314 and the beam splitter 110, for example as shown in FIG. 2. According to a further embodiment, the optical element 128 is a focus shifter. According to a further embodiment, an optical element 228, in particular an optical element for focusing the laser beam, may be arranged (for example alternatively or in addition to the optical element 128) between the laser source and the at least one movable mirror 314, for example as shown in two dashed lines.

According to another embodiment, the laser processing device 108 comprises a control device 120 for controlling components of the laser processing device (for example, the actuator arrangement 118 and, if present, the laser source 116) by control signals 122. According to an embodiment, the control device comprises a processor device 124 and a memory device 126 for storing a computer program executable on the processor device 124 for thereby realizing functions of embodiments of the subject matter disclosed herein.

According to a further embodiment, a further actuator arrangement 130 is provided for positioning the optical arrangement 200 and the surface 107 relative to each other. This may be advantageous, for example, in a large area laser processing operation in which, for example, the resulting interference pattern is moved across the surface 107. According to an embodiment, the further actuator arrangement 130 may be controlled by the control device 120 of the laser processing device via control signals 122, or alternatively by an external control device (not shown in FIG. 2). It should be understood that the (further) actuator arrangement 130 is shown in the drawings by way of example only, in particular with respect to position. For example, it may be envisaged that the optical arrangement and, where appropriate, further components of the laser processing device, for example the at least one movable mirror 314, the actuator arrangement 118, the optics 128 or the optics 228, are movable relative to the laser source 116 and the surface 107. For example, the optical arrangement 100 (and optionally the optics 228) may be mounted on a robotic arm for positioning (and optionally moving) these components across the surface 107. In this case, the robotic arm forms the actuator arrangement 130 or a part of the actuator arrangement 130.

FIG. 3 shows a portion of a laser processing device 208 in accordance with embodiments of the subject matter disclosed herein.

The laser processing device 208 may comprise one or more features described with reference to the laser processing device 108 of FIG. 2, even though the features in question are not shown in FIG. 3.

According to an embodiment, the laser processing device 208 comprises an optical arrangement 300. Unlike the optical arrangement 200 described with reference to FIG. 2, the optical arrangement 300 comprises two mirrors 114, 214 in each of the radiation paths 112, 212. Furthermore, according to an embodiment, the optical element 228 for focusing the laser beam 102 in the beam direction is arranged in front of (upstream) the at least one movable mirror 314. Furthermore, according to an embodiment, no optical element is arranged between the at least one movable mirror 314 and the beam splitter 110 (which may be implemented by a semi-permeable mirror, for example as shown in FIG. 3).

FIG. 4 shows a portion of a laser processing device 308 in accordance with embodiments of the subject matter disclosed herein.

The laser processing device 308 may comprise one or more features described with reference to the laser processing device 108 of FIG. 2, even though the features in question are not shown in FIG. 4.

According to an embodiment, the laser processing device 308 comprises an optical arrangement 400. According to an embodiment, the beam splitter 110 of the optical arrangement is formed by a diffractive optical element (DOE) that splits the laser beam 102 into the at least two partial beams 104, 204.

According to an embodiment, the diffractive optical element is configured such that the at least two partial beams 104, 204 leaving therefrom enclose an acute angle, for example as shown in FIG. 4.

According to an embodiment, each of the radiation paths 112, 212 of the at least two partial beams 104, 204 comprises a single optical element, such as a single mirror 214.

The optical arrangements 300, 400 described with reference to FIGS. 3 and 4 require comparatively few optical elements lying in the radiation paths 112, 212, but at the expense of a very flat angle of incidence on the final mirrors 214, which may result in distortion of the relevant partial beam 104, 204.

Figure 5:
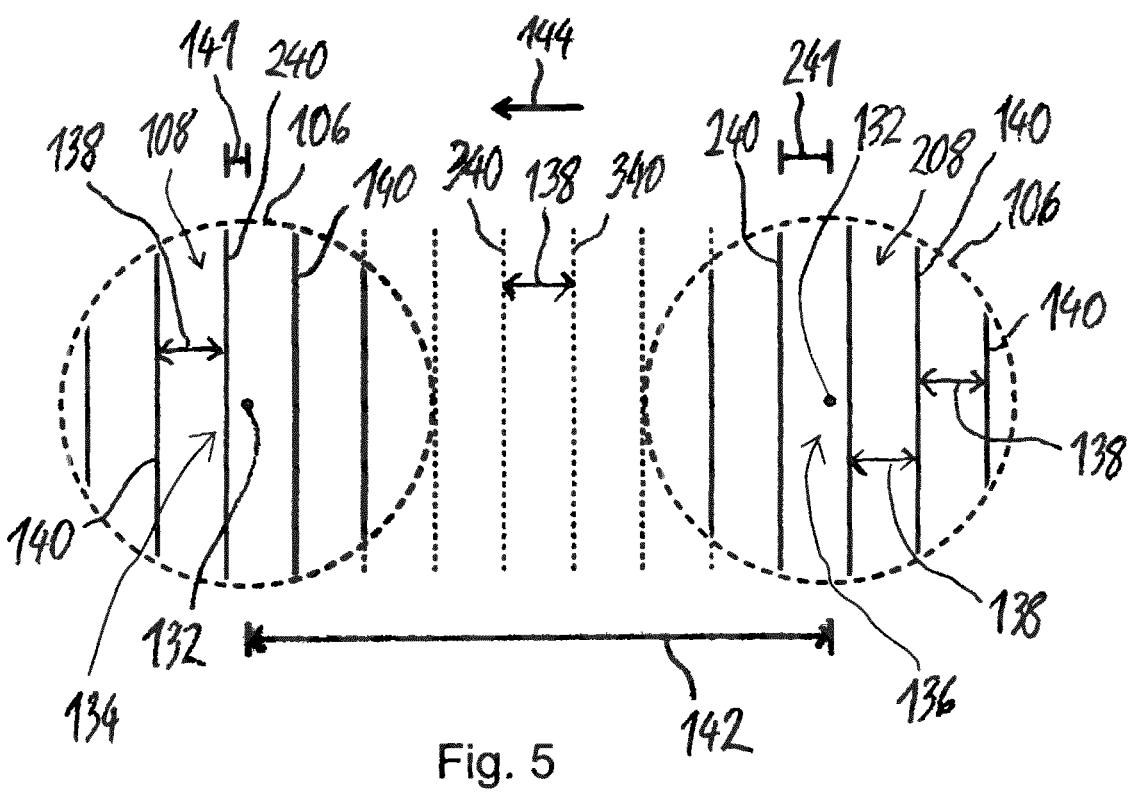
FIG. 5 shows a first interference pattern and a second interference pattern as may be generated by a laser processing device according to embodiments of the subject matter disclosed herein.

FIG. 5 shows a first interference pattern 108 and a second interference pattern 208, as may be generated by a laser processing device in accordance with embodiments of the subject matter disclosed herein.

According to an embodiment, the first interference pattern 108 is formed by a laser spot 106 having a center 132 located at a first position 134, while the second interference pattern 208 is formed by the laser spot 106 having the center 132 located at a second position 136. The statement that "the center 132 of the laser spot 106 is located at a particular position" (for example, the first position 134) is also abbreviated herein to the statement that "the laser spot 106 is located at the particular position." The two formulations are therefore to be considered equivalent. According to an embodiment, the laser spot 106 was generated at the first position 134 and at the second position 136 by adjusting, for the first position 134, a first state (according to an embodiment with respect to position and angle of incidence of the laser beam) for the laser beam at the input of the optical arrangement, while adjusting, for the second position 136 of the laser spot 106, a second state for the laser beam at the input of the optical arrangement.

Thus, the change in state (for example, the change in position and angle of incidence) of the laser beam results in a position change 142 (also referred to herein as DS) of a position of the center 132 of the laser spot 106.

According to an embodiment, the optical arrangement generating the laser spot 106 is configured such that the second interference pattern 208 continues the first interference pattern 108 in phase, for example as shown in FIG. 5. The in-phase continuation of the interference pattern results in a two-beam interference, for example, to a constant distance 138 (also denoted herein as L) between two adjacent interference maxima "even across (beyond) the boundaries of a single laser spot."

Therefore, the phase relationship of the interference maxima 140 of the second interference pattern 208 is consistent with the phase relationship of the interference maxima 140 of the first interference pattern 108. In other words, a change of a first distance 141 between the center 132 of the laser spot 106 and an interference maximum 240 closest in a predetermined direction 144 at the first position 134 to a second distance 241 between the center 132 of the laser spot 106 and the interference maximum 240 closest in the predetermined direction 144 at the second position 136 is performed by the optical arrangement. Here, the difference between the first distance 141 and the second distance 241 corresponds to the distance change DP.

According to an embodiment, the optical arrangement ensures the in-phase continuation of the first interference pattern for a continuous position change (at least within a range of validity, for example a range of validity for the position change). In this way, a continuous position change of the center 132 of the laser spot 106 from the first position 134 to the second position 136 results in a continuous sweep of the area between the first interference pattern 108 and the second interference pattern 208. Since phase truth is ensured at each position, interference maxima 340 (shown dashed in FIG. 5), which have the same phase relationship as the interference maxima 140 of the first interference pattern 108 and the interference maxima 140 of the second interference pattern 208, also result between the first position and the second position. In other words, all interference maxima 140, 240, 340 resulting from a continuous position change between the first position 134 and the second position 136 are in phase, for example as shown in FIG. 5.

Figures 6, 7, 8:
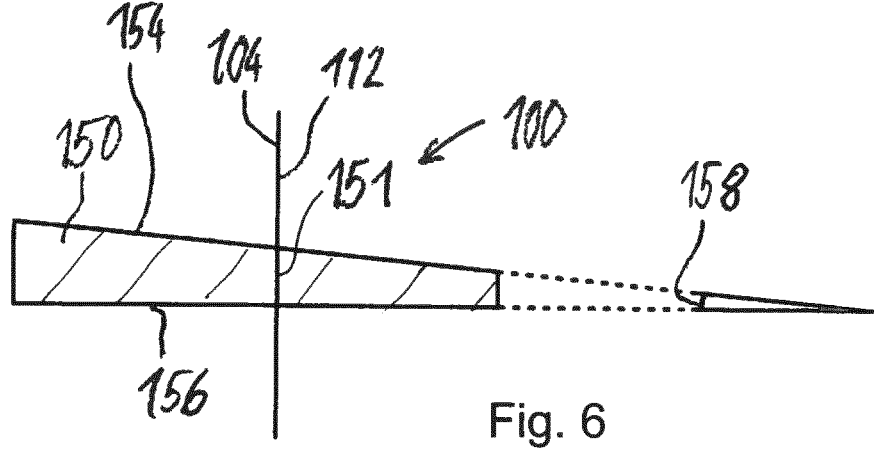
FIG. 6 shows, in a sectional view, a portion of an optical arrangement of a laser processing device according to embodiments of the subject matter disclosed herein.
FIG. 7 shows a portion of an object according to embodiments of the subject matter disclosed herein.
FIG. 8 shows a portion of an object according to embodiments of the subject matter disclosed herein.

FIG. 6 shows, in a sectional view, a portion of an optical arrangement 100 of a laser processing device in accordance with embodiments of the subject matter disclosed herein.

According to an embodiment, the optical arrangement 100 comprises at least one transmitting optical element 150 that includes a portion 151 located in a radiation path 112 of at least one of the partial beams, for example the partial beam 104 of FIG. 1.

According to an embodiment, the transmitting optical element 150 comprises a transirradiated surface pair comprising a first surface 154 and a second surface 156. According to another embodiment, the pair of surfaces 154, 156 encloses an angle 158 that is at most 10 degrees according to an embodiment.

FIG. 7 shows a portion of an object 160 according to embodiments of the subject matter disclosed herein.

According to an embodiment, the object has a surface 107 that comprises a periodic surface structure 162. According to an embodiment, the surface structure 162 has a plurality of parallel trenches shown in FIG. 7 by a plurality of parallel lines 164. It is noted that the lines 164 do not represent the dimensions of the trenches of the surface structure 162 but are merely intended to illustrate periodicity. In fact, according to an embodiment, for example in a riblet application, the trenches are wider than the ridges remaining between the trenches. In this sense, according to an embodiment, the lines 164 may represent, for example, a centerline (or a centroid line) of the trenches. According to an embodiment, the surface structure is a riblet structure with a plurality of riblets as described in WO 2018/197555 A1, i.e. a surface structure which reduces a flow resistance of the surface compared to a smooth surface. In particular, with respect to the application, function, shape, dimensions, properties, etc. of the riblets, express reference is made to WO 2018/197555 A1, the entire disclosure of which, in particular the dimensions and applications of the riblets, is incorporated herein by reference.

As usual for riblets, the trenches each have lateral walls in an embodiment. The adjacent walls of each two adjacent trenches therefore form two opposite flanks of a ridge between the two trenches. In other words, according to an embodiment, the plurality of trenches generates a plurality of ridges in the surface which, when suitably dimensioned, act as ridges (i.e. reduce a flow resistance across the surface), for example as described in WO 2018/197555 A1 cited above. According to an embodiment, the flanks of the ridges enclose an acute angle. In particular, according to an embodiment, the ribs are tapered (pointed).

According to an embodiment, the ridges extend substantially parallel to each other and in particular parallel to a flow direction of an expected flow over the surface.

According to an embodiment, the periodic surface pattern 162 is generated by light exposure to a laser spot, which is shown in FIG. 7 in a first position by the dashed line at 106. According to an embodiment, the surface structure 162 is generated by generating the laser spot 106 at different positions on the surface 107. According to an embodiment, the laser spot at each position has an interference pattern that continues the interference pattern of the laser spot at the first position in phase, for example as shown in FIG. 7. According to an embodiment, the surface 107 is processed by each interference pattern, each interference pattern generating a processing spot 169 in the surface 107. According to an embodiment, a sequence of interference patterns or processing spots 169 results in the surface structure 162. If the laser source is a pulsed laser source, continuous movement of the laser beam across the input of the optical arrangement (not shown in FIG. 7) results in discrete processing spots 169 that overlap and are distinguishable from each other, for example as shown in FIG. 7, when, for example, the pulse frequency of the laser and the speed of movement of the laser beam across the input of the optical arrangement is appropriately selected.

According to an embodiment, the processing spots 169 may be generated along a straight line, for example in a direction 167 across the surface 107, for example as shown in FIG. 7.

As a result, the overlapping machining spots 169 define a circumferential line 168 which is an envelope of the surface structure and which, according to an embodiment, has, at least in a circumferential line portion, for example in a circumferential line portion 170 shown in FIG. 7, a shape which is a periodic repetition of a basic element, some of which are indicated in FIG. 7 by reference numeral 171. According to an embodiment, the basic element is at least in sections arcuate, for example circular arcuate, as shown in FIG. 7. According to another embodiment, the basic element may be a segment of an ellipse or a differently shaped basic element. According to an embodiment, for example when the surface structure 162 is to be exposed to flow, an arcuate basic element or arcuate portion of the basic element may cause the flow to enter the surface structure not along a straight line and thus in a very narrow entry region, but over an entry region which is expanded in the direction of flow. This can be advantageous from a fluidic point of view.

According to an embodiment, a periodicity of the periodic surface structure 162 is different from a periodicity of the circumferential line portion 170, for example as shown in FIG. 7. According to an embodiment, the difference in the periodicity of the surface structure 162 and the circumferential line portion 170 stems from the fact that the periodicity of the surface structure 162 is defined by the interference of the at least two partial beams, whereas the periodicity of the circumferential line portion 170 is defined by the dimensions of the laser spot and the overlap of the processing spots 169 generated therewith.

FIG. 8 shows a portion of another object 260 according to embodiments of the subject matter disclosed herein.

According to an embodiment, a surface 107 of the object 260 has a periodic surface structure 162 generated by moving the laser spot 106 in two directions that are linearly independent of each other. For example, the laser processing device may be configured to move the laser spot 106 along a meandering path 172, for example as shown in FIG. 8. For example, moving the laser spot 106 in two directions that are linearly independent of each other may be realized by positioning the laser spot along a first path portion 174 parallel to a first direction 167 and positioning the laser spot along a second path portion 176 that is oblique or sloped (for example, perpendicular) to the first path portion 174. Further, it may be provided that the movement of the laser spot 106 in two directions that are linearly independent of each other comprises two parallel path portions, for example two parallel path portions 174, 178 as shown in FIG. 8. According to an embodiment, the movement in the two parallel path portions is in opposite directions, indicated in FIG. 8 at 182 thereby realizing for example a meandering path, for example as shown in FIG. 8. According to an embodiment, the movement of the laser spot in parallel path portions can always be in the same direction (not shown in FIG. 8). For an overlapping of the laser spots on the parallel path portions, a backward movement (along a second path portion, not shown in FIG. 8) is then required, during which, according to an embodiment, the laser beam is switched off so that no laser spot is generated during the backward movement. Further, according to an embodiment, it may be provided that along the second path portion 176 the laser beam is switched off so that no laser spot is generated along the second path portion. For example, it may be provided that only in the end points of a path portion, for example the second path portion 176, the laser beam is switched on and thus a laser spot is generated in the end points, for example as shown in FIG. 8.

According to an embodiment, a positioning of the laser spot along parallel path portions, for example along the parallel path portions 174, 178 is generated by a movement of the laser beam across the input of the optical arrangement, while a movement oblique to the parallel path portions, for example along the path portions 176, 180 is generated by a movement of the surface 107 with respect to a reference point 184. This has the advantage that large surfaces may be processed. A movement of the surface 107 with respect to the optical arrangement may, for example, be continuous, wherein according to an embodiment, in order to realize a predetermined path (for example, the meandering path as shown in FIG. 8), the laser processing device is configured to perform a correction movement by a movement of the optical arrangement with respect to the reference point 184, thereby positioning the laser spot along the predetermined path. According to another embodiment, instead of moving the surface 107 with respect to the reference point 184, the laser processing device may be configured to also produce movement oblique to the parallel path portions (for example, perpendicular to the parallel path portions) by moving the laser beam across the input of the optical arrangement. In general, for example, the actuator arrangement 118 and the at least one movable mirror 314 may be configured to provide movement of the laser beam 102 in two directions that are linearly independent of each other. According to an embodiment, the actuator arrangement 118 and the at least one movable mirror 314 may be formed by a galvanometer scanner known per se.

According to an embodiment, the surface structure 162 defines a first circumferential line portion 170 of an inserting circumferential line, wherein the circumferential line portion 170 has a shape that is a periodic repetition of a basic element 171. According to another embodiment, the surface structure 162 has a second circumferential line portion 172 having a shape that is a periodic repetition of a basic element 171, wherein the second circumferential line portion 172 is opposite the first circumferential line portion 170, for example as shown in FIG. 8. According to an embodiment, the second circumferential line portion 172 is a mirror image of the first circumferential line portion 170, for example as shown in FIG. 8.

It is understood that under certain conditions, a circumferential line portion may not have a shape that is (recognizably) a periodic repetition of a basic element, for example, when the laser beam is emitted continuously (not pulsed) during positioning of the laser spot 106 along the first path portion 174, or when the overlap of the interference patterns of the individual pulses is very high. However, in such a case, another circumferential line portion 185, 186 may well have a shape which is a periodic repetition of a basic element, for example when the continuous laser beam is switched off during positioning in a direction 188 of this other circumferential line portion 185, 186.

Figures 9, 10, 11, 12, 13:
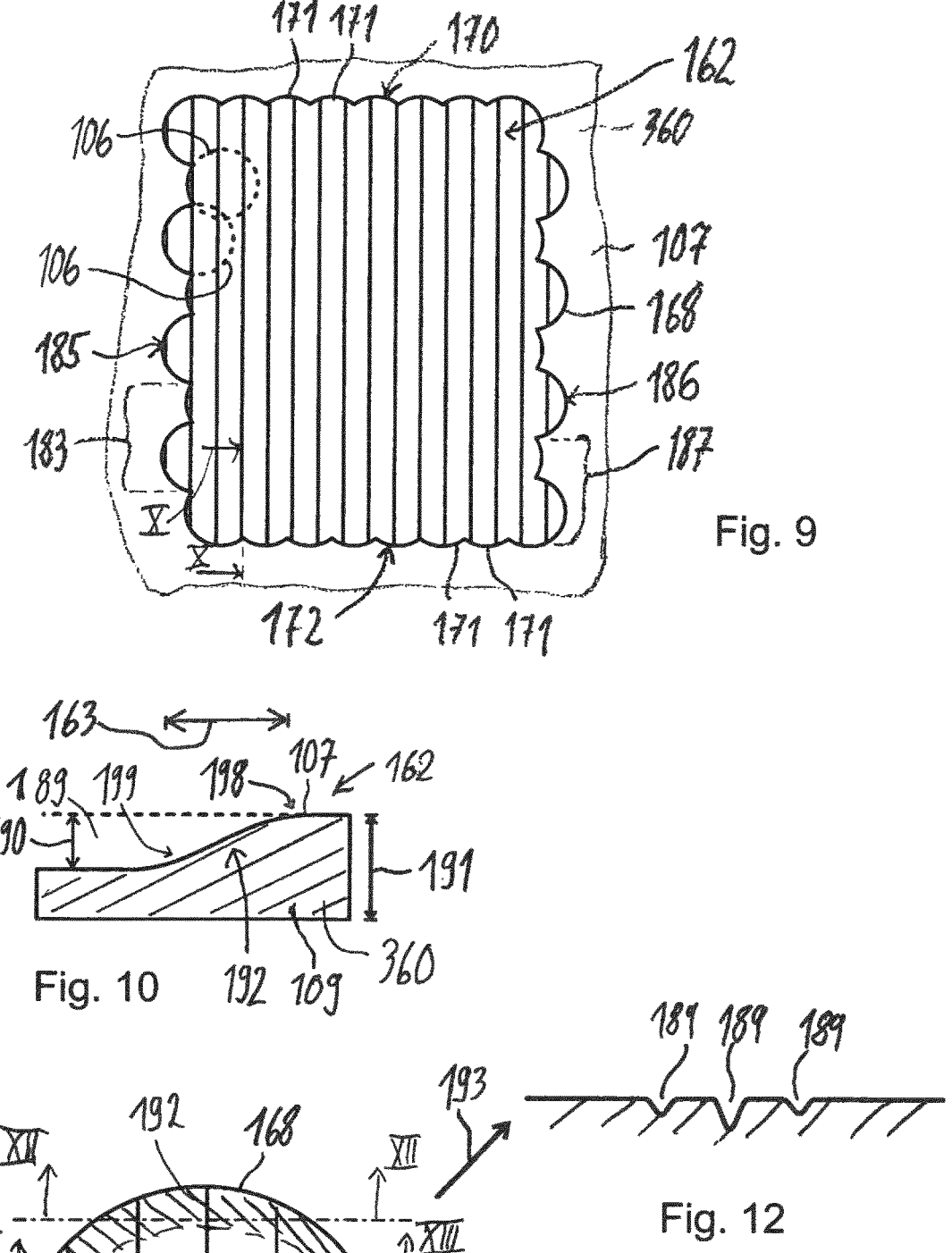
FIG. 9 shows a portion of an object according to embodiments of the subject matter disclosed herein.
FIG. 10 shows a cross-sectional view of a portion of the surface structure of FIG. 9 along the intersection line X-X in FIG. 9.
FIG. 11 shows a top view of a portion of a surface structure according to embodiments of the subject matter disclosed herein.
FIGS. 12 and 13 show a cross-sectional view of the surface structure of FIG. 11 along the intersection lines XII-XII and XIII-XIII, respectively, in FIG. 11.

FIG. 9 shows a portion of an object 360 according to embodiments of the subject matter disclosed herein.

Similar to FIG. 8, FIG. 9 also shows the object 360 having a surface 107 that comprises a periodic surface structure 162 defining a circumferential line 168 that is an envelope of the surface structure 162. According to an embodiment, the circumferential line 168 comprises a first circumferential line portion 170 and a second circumferential line portion 172 which are a periodic repetition of a basic element 171, wherein according to an embodiment the basic element 171 comprises a single arcuate portion, for example as shown in FIG. 9. According to a further embodiment, the circumferential line 168 comprises a third circumferential line portion 185 which is a periodic repetition of a basic element 183 comprising two arcuate portions, for example as shown in FIG. 9. According to a further embodiment, the circumferential line 168 has a fourth circumferential line portion 186 which is a periodic repetition of a further basic element 187 consisting of two arcuate portions, for example as shown in FIG. 9.

FIG. 10 shows a cross-sectional view of a portion of the surface structure 162 of FIG. 9 along the intersection line X-X in FIG. 9.

According to an embodiment, the surface 107 is formed by a lacquer layer 109 formed on a body of the object 360 (the body is not shown in FIG. 10). According to an embodiment, the lacquer layer 109 is a cured lacquer layer, such as a lacquer layer of an aircraft. According to an embodiment, the surface structure 162 has a plurality of trenches 189, one of which is exemplarily shown in sectional view in FIG. 10. According to an embodiment, the surface structure, and thus at least one of the trenches 189, has a maximum extent in depth (or depth) 190, which according to an embodiment is less than a thickness 191 of the lacquer layer 109.

According to another embodiment, an extent in depth of the surface structure 162 increases to 80% of the maximum extent in depth from a first position 198 at an edge of the surface structure 162 to a closest second position 199. "Closest" in this sense means that if there are several second positions where the extent in depth is 80% of the maximum extent in depth, the one with the least distance to the first position 198 is selected. According to another embodiment, a distance 163 between the first position 198 and the second position 199 is at least 100 μm, for example at least 300 μm or at least 500 μm.

For example, according to an embodiment, the depth 190 in an edge region 192 of the trench 189 is reduced and goes continuously towards zero, i.e. to the level of the surface 107, for example as shown in FIG. 10. According to an embodiment, the configuration of the surface structure 162 in its edge region 192 is due to a penetration behavior of the laser, whereby in the edge region 192 the ablation by the laser spot is lower, since the laser spot typically has a lower intensity in its edge region than in the center of the laser spot (averaged over the interference pattern of the laser spot). The penetration behavior with the characteristics described herein is achievable, for example, by the surface being formed by a lacquer layer and the processing being performed with a CO2 laser.

According to an embodiment, the lacquer surface is a lacquer surface as described in WO 2018/197555 A1. In particular, the lacquer surface may be formed by a polymerbased lacquer, in particular based on polyurethane or acrylic or epoxy. According to an embodiment, the lacquer is a clear lacquer (clear coat) or a top lacquer (topcoat). According to an embodiment, an absorption spectrum of the lacquer has an overlap with an emission spectrum of a CO2 laser. According to an embodiment, the CO2 laser is operable at a wavelength in the range between 9 μm and 11 μm.

According to an embodiment, the lacquer contains pigments that affect a coloration of the lacquer. Typically, a top lacquer contains such pigments. According to another embodiment, the pigments change an absorption behavior of the lacquer for the laser beam. According to an embodiment, the penetration behavior of a laser can be influenced by the type and concentration of the pigments.

According to an embodiment, the lacquer is a first lacquer which is arranged on a second lacquer. Consequently, the layer of the first lacquer is also referred to as a top lacquer layer and the layer of the second lacquer is consequently also referred to as a base lacquer layer. According to an embodiment, the top lacquer layer is a clear lacquer layer or a top lacquer layer, in particular polyurethane-based. According to a further embodiment, the base lacquer layer (basecoat layer) is formed by an epoxy system (for example, a cured epoxy resin) or, more generally, by a plastic.

FIG. 11 shows a top view of a portion of a surface structure 162 according to embodiments of the subject matter disclosed herein.

As explained above, the surface structure 162 defines an envelope, also referred to herein as a circumferential line 168. Similar to the figures explained above, the surface structure 162 in FIG. 11 is only schematically represented by a plurality of parallel lines, each of the lines representing a trench 189 in the surface (not shown in FIG. 11).

FIGS. 12 and 13 show a cross-sectional view of the surface structure 162 of FIG. 11 along the intersection lines XII-XII and XIII-XIII, respectively, in FIG. 11. The correlation of the corresponding intersection lines to FIG. 12 and FIG. 13 is further illustrated by arrows 193.

According to an embodiment, the parallel trenches 189 have a reduced depth in an edge region 192 (shown hatched in FIG. 11), for example as shown when FIG. 11 is viewed together with FIG. 12 and FIG. 13.

The increasing extent in depth from an edge of the surface structure is also evident in FIG. 12 and FIG. 13. It should be understood that, provided that at a percentage of 80% of the maximum extent in depth the surface structure has no depression, the second position 199 corresponding to 80% of the maximum extent in depth may also be determined by interpolation or extrapolation. According to an embodiment, it may be provided, for example, that departing from the first position, the second position is determined in a direction along the largest gradient of the extent in depth of the surface structure.

Figure 14:
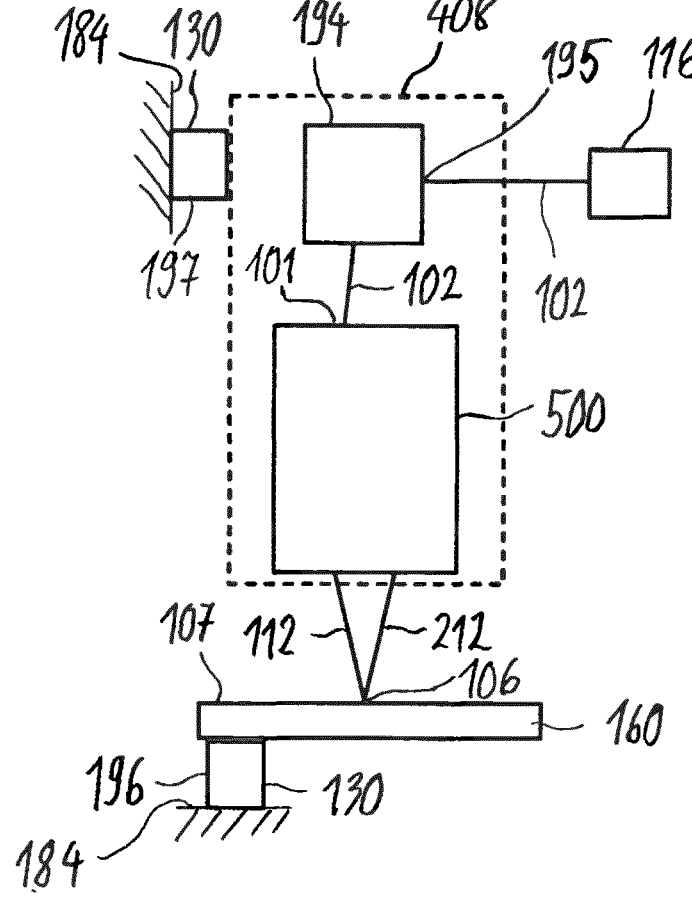
FIG. 14 shows a laser processing device according to embodiments of the subject matter disclosed herein.

FIG. 14 shows a laser processing device 408 in accordance with embodiments of the subject matter disclosed herein.

According to an embodiment, the laser processing device 408 comprises an optical arrangement 500 formed according to one or more of the embodiments disclosed herein.

According to another embodiment, the laser processing device 408 comprises a scanning device 194, which may comprise, for example, an actuator arrangement and at least one movable mirror according to embodiments of the subject matter disclosed herein. According to an embodiment, the scanning device 194 is formed by a galvanometer scanner. According to an embodiment, the scanning device 194 is arranged to direct a laser beam 102 towards an input 101 of the optical arrangement 500, or to move the laser beam 102 across the input 101 of the optical arrangement 500.

According to another embodiment, the laser processing device 408 comprises a laser input 195 that is couplable to a laser source 116. According to an embodiment, the laser input 195 is formed by the scanning device 194, for example as shown in FIG. 14. According to an embodiment, the laser source 116 is external to the laser processing device 408. For example, if the laser processing device 408 is mounted on a robotic arm, the laser source 116 may be positioned adjacent the robotic arm on the floor and optically coupled to the laser input 195. According to another embodiment (not shown in FIG. 14), the laser source 116 is a part of the laser processing device 408.

According to an embodiment, the optical arrangement generates at least two partial beams 112, 212 from the laser beam 102 that generate an interference pattern in a laser spot 106.

According to an embodiment, an object 160 is positioned with respect to the optical arrangement 500 such that the laser spot 106 is positioned on a surface 107 of the object 160.

According to an embodiment, the laser processing device is associated with a further actuator arrangement 130 by means of which the optical arrangement 500 and the object 160 are movable relative to each other, for example in order to pattern a surface portion of the object 160 which cannot be covered solely by moving the laser beam 102 via the input 101 of the optical arrangement 500.

According to an embodiment, the further actuator arrangement 130 comprises at least one first actuator 196 with which the object 160 is movable with respect to a reference point 184. According to an embodiment, the further actuator arrangement 130 further comprises at least one second actuator 197 with which the laser processing device 408 is movable with respect to the reference point 184. According to an embodiment, the at least one second actuator 197 is formed by a robotic arm.

It should be noted that entities disclosed herein (such as a device, a feature, a process step, a control device, an actuator arrangement, an optical arrangement, an actuator, an optical element, etc.) are not limited to the decided entities as described in some embodiments. Rather, the subject matter disclosed herein may be implemented in a variety of ways while still providing the specific functionality disclosed.

In particular, the subject matter described herein may be provided in different ways with different granularity at the device level, at the process level, or at the software level, while still providing the specified functionality. Further, it should be noted that according to embodiments, a separate entity may be provided for each of the functions disclosed herein. According to other embodiments, an entity may be configured to provide two or more functions as described herein. For example, according to an embodiment, the function of the two mirrors 214 in FIG. 2 may be provided by a single roof-edge mirror. According to yet other embodiments, two or more entities may be configured to collectively provide one function as described herein.

It should be noted that the implementations described herein in the drawings represent only a limited selection of possible embodiments of the subject matter disclosed herein. Thus, it is possible to appropriately combine the features of individual embodiments with each other, so that for those skilled in the art, a plurality of different embodiments is to be considered disclosed with the embodiments made explicit herein. Furthermore, it should be mentioned that terms such as "a" or "an" do not exclude a plurality. Terms such as "containing" or "comprising" do not exclude further features or process steps. The terms "having" or "containing" or "comprising" each include the two meanings "comprising, inter alia" and "consisting of".

It should further be noted that while the exemplary subject matter and elements (for example, laser processing devices, optical arrangements, etc.) in the drawings show a particular combination of several embodiments of the subject matter disclosed herein, any other combination of embodiments is equally possible and is to be considered disclosed by this application.

An advantageous combination of embodiments of the subject matter disclosed herein may be summarized as follows:

A laser processing device comprising: an optical arrangement; wherein the optical arrangement comprises an input for receiving a laser beam; wherein the optical arrangement comprises a beam splitter that splits the laser beam into at least two partial beams; wherein the optical arrangement recombines the partial beams into a laser spot for generating an interference pattern in the laser spot; wherein a first state of the laser beam at the input generates a first interference pattern and a second state of the laser beam generates a second interference pattern; wherein the first state and the second state differ in at least one of (i) a position of the laser beam at the input and (ii) an angle of incidence of the laser beam with respect to the input; and wherein the optical arrangement is configured such that the second interference pattern continues the first interference pattern in phase.

The invention claimed is:

1. A laser processing device comprising:

an optical arrangement;

wherein the optical arrangement comprises an input for receiving a laser beam; and wherein the input includes a beam splitter that splits the laser beam into at least two partial beams;

and wherein the optical arrangement recombines the at least two partial beams into a laser spot for generating an interference pattern in the laser spot;

wherein a first state of the laser beam at the input defines a first position P1 of a center of the laser spot and a first interference pattern;

wherein a second state of the laser beam at the input defines a second position P2 of the center of the laser spot and a second interference pattern;

wherein a change from the first state to the second state includes a change in a position of the laser beam at the input and/or a change in an angle of incidence of the laser beam with respect to the input;

wherein the change from the first state to the second state causes at least one of a distance change DP and a position change DS, wherein (i) the distance change DP is a difference between a first distance and a second distance, wherein the first distance is between the first position P1 of the center of the laser spot in the first state and an interference maximum closest to the first position P1 of the first interference pattern in a first direction that intersects an interference line of the first interference pattern and wherein the second distance is between the second position P2 of the center of the laser spot in the second state and an interference maximum closest to the second position P2 of the second interference pattern in the first direction, and (ii) the position change DS is a difference between the first position P1 and the second position P2;

wherein the optical arrangement is configured to change the position change DS continuously during a change from the first state to the second state such that a condition $$|DS|+|DP|=n*L$$

is valid, and wherein n is a natural number;

wherein L is a distance in the first direction between two adjacent interference maxima of the first interference pattern or the second interference pattern, including a tolerance error range of ±5%.

2. The laser processing device according to claim 1, wherein the at least two partial beams include two partial beams;

the two partial beams in the first state have a first optical path length difference DI_A from the beam splitter to the laser spot;

the two partial beams in the second state have a second optical path length difference DI_B from the beam splitter to the laser spot;

the optical arrangement provides, for the position change DS=P1−P2, where P1 is the first position and P2 is the second position, a difference DI_AB=DI_A−DI_B between the first optical path length difference and the second optical path length difference which causes the distance change DP so that the second interference pattern continues the first interference pattern in phase.

3. The laser processing device according to claim 1, wherein the condition is valid at least up to a position change value equal to the diameter of the laser spot.

4. The laser processing device according to claim 1, wherein the input comprises a first region and a second region;

an actuator arrangement for positioning the laser beam in the first region and subsequently in the second region.

5. The laser processing device according to claim 1, wherein the optical arrangement comprises at least one optical element operating in transmission.

6. The laser processing device according to claim 5, wherein a change of a path length section of a radiation path of each of the partial beams, the radiation path of which passes through the optical element, in the optical element is smaller than ±5%, wherein the change of the path length section is caused by a change in state of the laser beam at the input.

7. The laser processing device according to claim 5, wherein a change of a path length section of a radiation path of each of the partial beams, the radiation path of which passes through the optical element, in the optical element is smaller than ±1%, wherein the change of the path length section is caused by a change in state of the laser beam at the input.

8. The laser processing device according to claim 5, wherein a change of a path length section of a radiation path of each of the partial beams, the radiation path of which passes through the optical element, in the optical element is smaller than ±0.5%, wherein the change of the path length section is caused by a change in state of the laser beam at the input.

9. The laser processing device according to claim 1, wherein all optical elements of the optical arrangement operate exclusively in reflection.

10. The laser processing device according to claim 1, wherein the beam splitter is a semi-permeable mirror.

11. The laser processing device according to claim 1, wherein, of each transmitting optical element of the optical arrangement downstream of the beam splitter, each transir-radiated surface pair located in a radiation path of at least one of the partial beams encloses an angle of at most 10 degrees.

12. The laser processing device according to claim 1, wherein, of each transmitting optical element of the optical arrangement downstream of the beam splitter, each transir-radiated surface pair located in a radiation path of at least one of the partial beams encloses an angle of at most 5 degrees.

13. The laser processing device according to claim 1, wherein the optical arrangement downstream of the beam splitter does not comprise a prism.

14. The laser processing device according to claim 1, wherein the laser beam is a CO2 laser beam.

15. The laser processing device according to claim 14, wherein the CO2 laser beam has a power of at least 800 W.

16. The laser processing device according to claim 1, wherein the laser processing device is arranged to pattern a lacquer surface.

17. A method of interference patterning a surface, the method comprising:

generating a first interference pattern on the surface;

generating a second interference pattern on the surface;

wherein the generating of the first interference pattern and the second interference pattern is performed by a single optical arrangement comprising an input including a beam splitter that splits the laser beam into at least two partial beams;

wherein a first position P1 of a center of a laser spot, that recombines the two partial beams, and the first interference pattern are generated by the laser beam being in a first state and a second position P2 of the center of the laser spot, that recombines the two partial beams, and the second interference pattern are generated by the laser beam being in a second state, wherein a change from the first state to the second state is performed by changing a position of the laser beam at the input and/or changing an angle of incidence of the laser beam with respect to the input, and thereby causing at least one of a distance change DP and a position change DS, wherein (i) the distance change DP is a difference between a first distance and a second distance, wherein the first distance is between the first position P1 and the interference maximum closest to the first position P1 of the first interference pattern in a first direction that intersects an interference line of the first interference pattern and wherein the second distance is between the second position P2 and the interference maximum closest to the second position P2 of the second interference pattern in the first direction, and (ii) the position change DS is a difference between the first position P1 and the second position P2;

wherein the position change DS is changed continuously by the optical arrangement during a change from the first state to the second state such that a condition $$|DS|+|DP|=n*L$$

is valid, and wherein n is a natural number;

wherein L is a distance in the first direction between two adjacent interference maxima of the first interference pattern or the second interference pattern, including a tolerance error range of ±5%.

18. A manufacturing method of objects containing interference patterned surfaces generated by emitting a laser beam on the surface of the objects, the manufacturing method including changing a position of the laser beam at an input of an optical arrangement including a beam splitter that splits the laser beam into at least two partial beams and/or changing an angle of incidence of the laser beam with respect to the input to generate a first state defining a first position P1 of a center of a laser spot, that recombines the two partial beams, and a first interference pattern, and a second state defining a second position P2 of the center of the laser spot, that recombines the two partial beams, and a second interference pattern; wherein (i) a distance change DP is a difference between a first distance and a second distance, wherein the first distance is between the first position P1 and an interference maximum closest to the first position P1 of the first interference pattern in a first direction that intersects an interference line of the first interference pattern and wherein the second distance is between the second position P2 and an interference maximum closest to the second position P2 of the second interference pattern in the first direction, and (ii) a position change DS is a difference between the first position P1 and the second position P2;

wherein the position change DS is changed continuously by the optical arrangement during a change from the first state to the second state such that a condition $$|DS|+|DP|=n*L$$

is valid, and wherein n is a natural number;

wherein L is a distance in the first direction between two adjacent interference maxima of the first interference pattern or the second interference pattern, including a tolerance error range of ±5%.

\* \* \* \* \*